United States Patent [19]
French et al.

[11] Patent Number: 4,585,934
[45] Date of Patent: Apr. 29, 1986

[54] SELF-CALIBRATION TECHNIQUE FOR CHARGE-COUPLED DEVICE IMAGERS

[75] Inventors: Donald E. French, Westlake Village; John A. Sekula, Los Angeles, both of Calif.

[73] Assignee: Hughes Aircraft Company, El Segundo, Calif.

[21] Appl. No.: 149,381

[22] Filed: May 13, 1980

Related U.S. Application Data

[63] Continuation of Ser. No. 17,876, Mar. 5, 1979, abandoned, which is a continuation-in-part of Ser. No. 760,318, Jan. 18, 1977, abandoned.

[51] Int. Cl.[4] .................... H01J 40/14; H01L 29/78; H01L 27/14; H01L 31/00
[52] U.S. Cl. .................. 250/211 J; 357/24; 357/30; 307/311
[58] Field of Search ............. 357/24 LR, 30; 250/211 J, 252; 356/230; 307/311

[56] References Cited

U.S. PATENT DOCUMENTS 3,020,406 2/1962 Whitney ............................. 250/353
3,529,895 9/1970 Pincus ................................ 356/230
3,883,437 5/1973 Nummedal et al. ........... 357/24 LR
3,979,587 9/1976 Sternberg et al. .................. 250/252
4,142,198 2/1979 Finnila et al. .................. 357/24 LR

OTHER PUBLICATIONS

Barbe "Solid State Infrared Imaging", Nato Advanced Study Institute, Louvain-La-Neuve, Belgium (9/75), published in Jespers et al., Eds, *Solid State Imaging* Noordhoff, Leyden, Netherlands (1976), pp. 673–687.
Melen et al., *IC Operational Amplifiers* H. W. Sams, Indianapolis (1971), p. 83.

*Primary Examiner*—Gene M. Munson
*Attorney, Agent, or Firm*—Thomas A. Runk; Anthony W. Karambelas

[57] ABSTRACT

A self-calibration technique which provides detector responsivity normalization for a charge-coupled device, hereinafter referred to as CCD, area imager. The CCD area imager is designed such that the detectors can be electrically decoupled from CCD multiplex register inputs. Calibration reference and gain normalization are provided by a pulsed light source and an analog divider circuit. This technique is applicable to both CCD visible imagers which are fabricated on an intrinsic semiconductor substrate and CCD infrared imagers which can be fabricated on an extrinsic or intrinsic substrate. The technique is applied to a visible imager for illustration of its self-calibration capability.

3 Claims, 6 Drawing Figures

SELF-CALIBRATION TECHNIQUE FOR CHARGE-COUPLED DEVICE IMAGERS

CROSS-REFERENCE TO RELATED APPLICATION

U.S. application Ser. No. 702,548 filed July 6, 1976, is incorporated by reference for details of the shift register structure shown therein.

This application is a continuation of application Ser. No. 17,876 filed on Mar. 5, 1979, now abandoned, which was a continuation-in-part of application Ser. No. 760,318 filed on Jan. 18, 1977, now abandoned.

BACKGROUND OF THE INVENTION

This invention is in the field of charge-coupled devices, hereinafter referred to as CCD, and particularly in a technique utilizing such devices as area imagers.

The response of detector cells in CCD area imagers typically varies in a random fashion by ±15%. This severely limits the imager sensitivity in point detection such as light from a star application.

Previous systems with discrete detectors have employed pre-programmed memories to store measured detector responsivity information which is used for normalization processing. This technique is unwieldy for the large numbers of detectors which can be fabricated in a monolithic form. Even if such off-chip memory would become manageable, transfer efficiency effects in the imager on the data stream would severely limit normalization accuracy.

SUMMARY OF THE INVENTION

The deficiency in sensitivity can be improved by over an order of magnitude, with implementation of accurate gain normalization by means of the self-calibration technique.

This technique can also be applied to thermal imaging systems. The fixed pattern noise which limits the minimum resolvable temperature is inherently cancelled to an extent such that sensitivity approaching that of scanned thermal imagers is possible.

Utilizing the inventive technique, transfer efficiency defects of the prior art are inherently compensated for, which results in improved normalization accuracy.

The method employed utilizes a charge-coupled device for calibrating a detector array. Such method includes collecting photogenerated charges, and injecting the charges into a charge-coupled register.

The method provides mechanism for storing the injected charges, and for collecting additional charges concurrently with the storing of these injected charges. The charges may be sensed when they are stored and when the additional charges are collected.

The sensed charges are then divided in terms of signal level to calibration level ratios.

The detector array is illuminated with pulsed electromagnetic energy to generate the calibration charge level.

Hence, charges are shielded from other charges which are generated within a photosensitive area of the device sensing the charges and during their division or normalization of signal to calibration level ratios.

Briefly in terms of structure, a charge-coupled self calibrating device is provided having a body of photosensitive material, and at least one semiconductor layer diffused in the surface of the body. Included is an epitaxial layer attached to a surface of each of said at least one semiconductor layer. Also included is an electrically conductive contact, one said contact being integral with each of said at least one semiconductor layer, said contact extending into said epitaxial layer. Said at least one semiconductor layer has an active detecting area integral within said body.

DETAILED DESCRIPTION

Referring to the FIGS. 1, 2, 2a and 4, a semiconductor two-dimensional matrix is shown at 10. Matrix 10 comprises a plurality of detectors 10a, 10b, 10c, 10d . . . 10n, where each of the detectors individually provides therein a pair of charge storage areas termed the C and the S charge areas, wherein the C area is used for calibration storage and the S area is used for signal storage, to wit $C_{11}$, $S_{11}$; $C_{12}$, $S_{12}$; $C_{21}$, $S_{21}$; $C_{22}$, $S_{22}$. The voltage amplitudes provided by the C areas being greater in magnitude than the S areas, or vice versa, or these magnitudes may be equal.

Matrix 10 may be generally mounted in an aperture 12 of mirror 14. Mirror 14 has an optically reflective surface 15.

Figure 1:
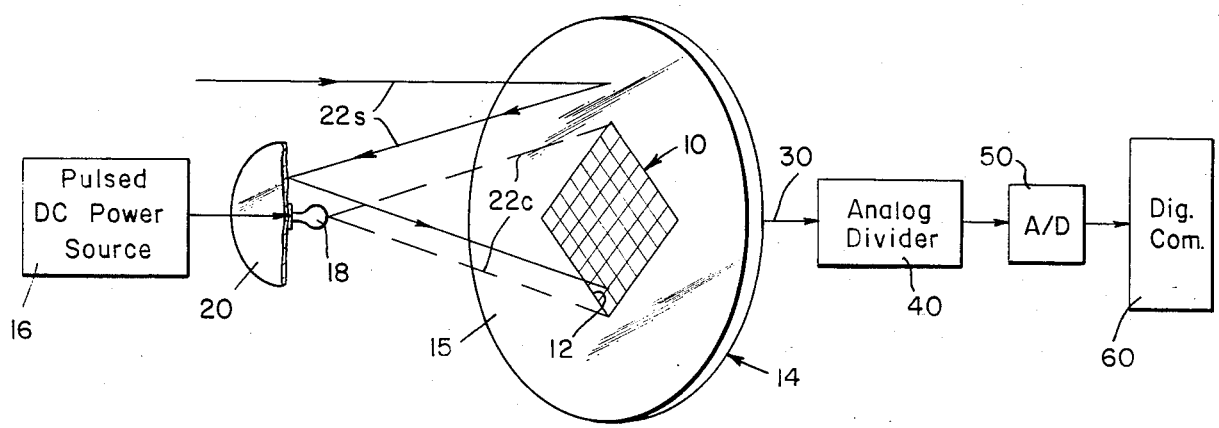
FIG. 1 is an electro-optical schematic of the structure according to the invention.
Figure 2:
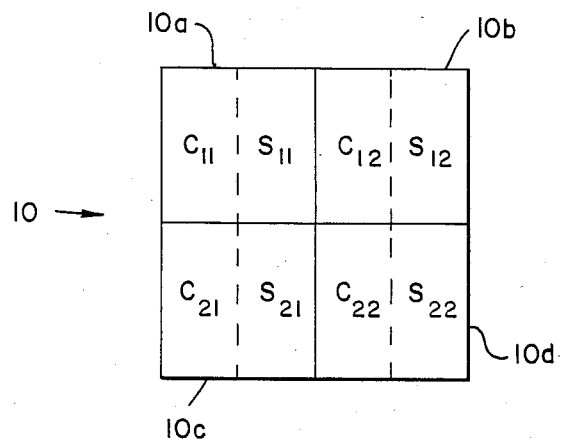
FIG. 2 is a matrix of charge storage calibration and signal areas provided within the structure of FIG. 4.

A pulsed DC power source 16 feeds a light emitting diode 18 or the like, which diode is mounted on a mirrored member 20, diode 18 emitting light as at 22c which envelopes matrix 10. the mirrored member 20 is capable of folding light rays such as 22s coming from a telescope external to FIG. 1.

Detector signals of matrix 10 are stored by CCD type multiplexers which include a semiconductor amplifier all within matrix 10, the amplifier output at 30, which amplifier converts the stored charges in the CCD elements of matrix 10 to voltages and feeds these voltages to analog divider 40.

Figure 2A:
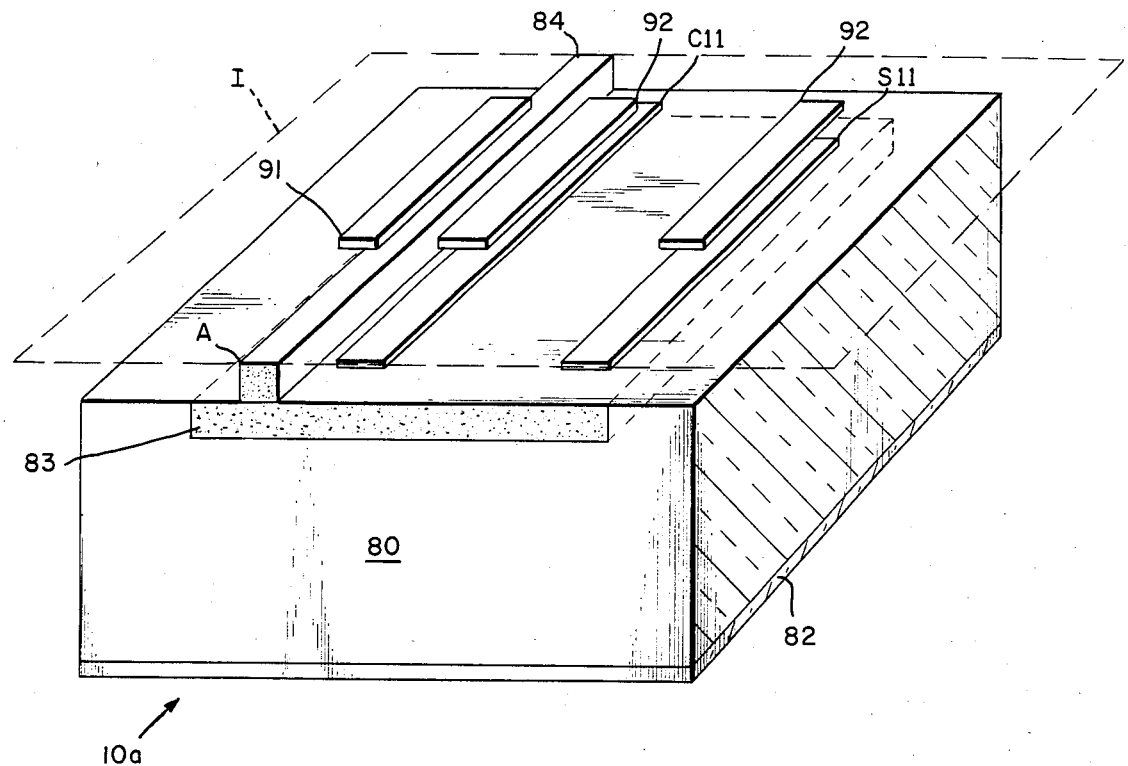
FIG. 2a is a functional perspective principally related to the interface at which storage for calibration and signal charges is created.
Figure 4:
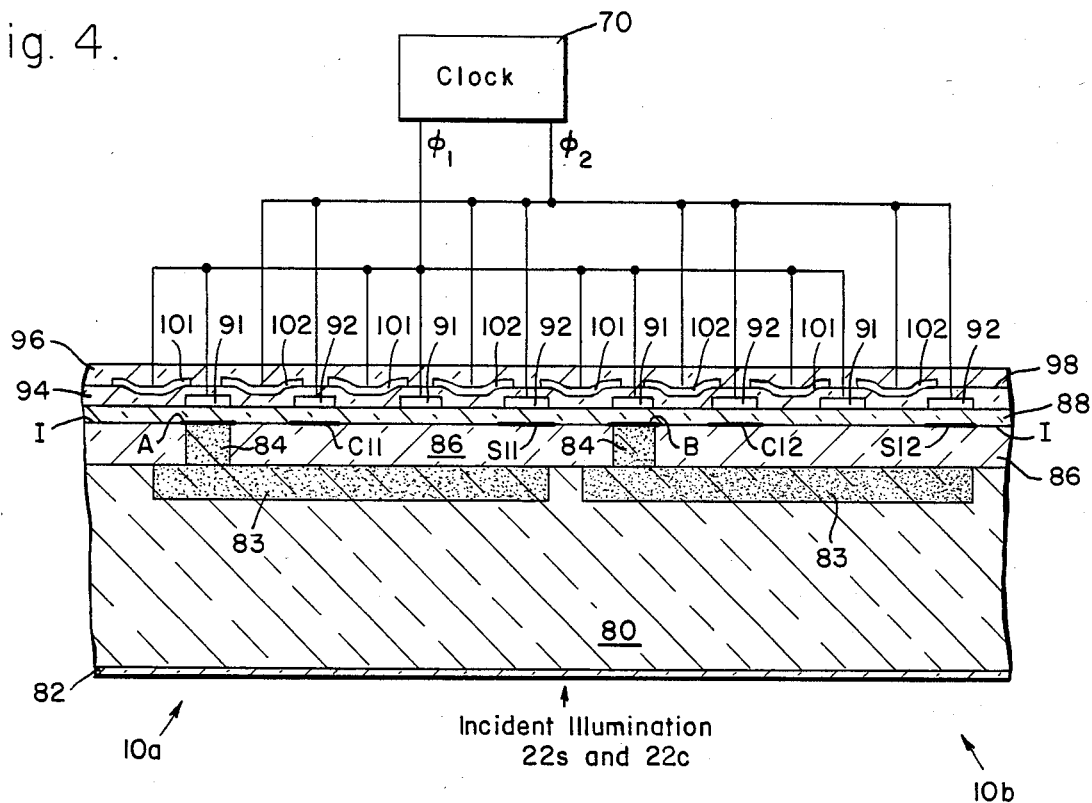
FIG. 4 is a cross-section view of a semiconductor structure showing details of elements of the matrix connected to outputs of a timing clock and the interface at which charge storage areas are created.
Figure 5:
FIG. 5 is a waveform output chart of the timing clock showing periodically such signals which are fed to the matrix.
Figure 5:
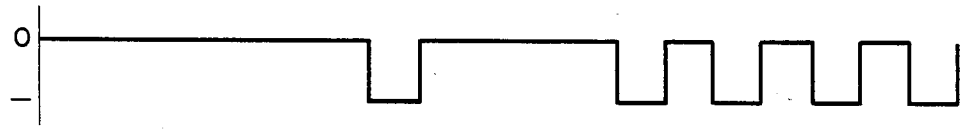
Figure 5:
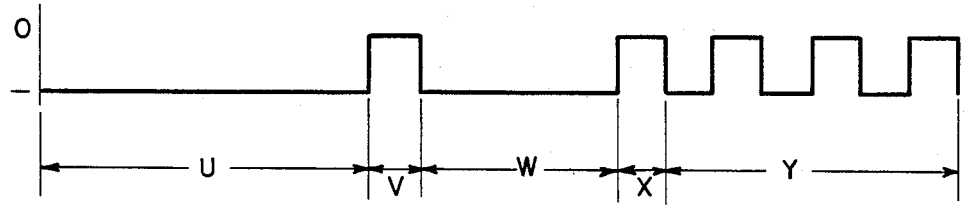

Details of structure of matrix 10 is provided in FIG. 4 and functions thereof shown in terms of clock waveform in FIG. 5 with the aid of FIG. 2a.

A clock at 70 providing phase voltage waveforms $\phi_1$ and $\phi_2$, exemplary only, as functions of time, feeds matrix 10.

Matrix 10 comprises phototsensitive body 80 attached to one surface of an electrically conductive and optically transparent material 82. Light 22s from the telescope passes through the undersurface of 10 and enters photosensitive body 80 through material 82.

Body 80 is generally a semiconductive material such as silicon or doped silicon or the like, which may be of the N or P types.

Semiconductor layers 83 are diffused into photosensitive area 80, which layers delineate the active detector areas.

An undoped epitaxial layer 86, of semiconductor material similar to the photosensitive material 80 having the same polarity type, is attached to area 80.

Electrically conductive contacts 84 extending only to the lower surface of oxide 88, are diffused through layer 86 and also make electrical contact with layers 83. Layers 83 collect signal and calibration charges from photosensitive area 80, and inject such charges by means of contacts 84 into the CCD storage locations.

An oxide layer 88 of electrically insulative material such as $SiO_2$ is attached to layer 86.

Calibration charge storage locations $C_{11}$, $C_{12}$... etc., and signal charge storage locations $S_{11}$, $S_{12}$ . . . etc., occur at interface I of layers 86 and 88 as may be seen from FIGS. 2a and 4. It is pointed out that storage locations C and S at interface I are exaggerated in their sizes in order to be able to illustrate these locations in the drawings for a better understanding of operation of this device. It should be understood that the illustrations of sites at A and B and at $S_{11}$, $C_{11}$ and $S_{12}$, $C_{12}$ are not structural components, but rather locations at which charges are stored by the inventive device. Likewise, interface I is an imaginary plane to enable discussion of operation this device.

With this in mind, and in accordance with illustrations FIGS. 2a and 4, it should be noted that initial charge storage sites are provided at locations A and B by clock voltage $\phi_1$ at interface I under electrodes 91. These sites collect both S and C type charges in sequential order. For example, the site at A initially collects $S_{11}$ and subsequently collects $C_{11}$ charges and the site at B initially collects $S_{12}$ and subsequently collects $C_{12}$ charges. The charges initially stored at site A are permitted to be transferred by shift register action to locations at interface I under electrodes 92 at sites as denoted by $S_{11}$ and $C_{11}$. Likewise, charges initially stored at site B are permitted to be transferred by shift register action to locations at interface I under electrodes 92 at sites as denoted by $S_{12}$ and $C_{12}$.

It should also be noted that clock voltages $\phi_1$ and $\phi_2$ perform the same functions and that at least two phases of clock signals from clock 70 are a convenient means to provide direction of charge transfer within device 10, that is, left to right transfer of charges from the several charge site locations as viewed in FIG. 4 to be eventually transferred to analog divider 40, which divider is well known in the art. During shift register action, the device performs a multiplexing function, shifting the charges out of the device into divider 40 in any desired order, for example in the order of $S_{11}$, $C_{11}$; $S_{12}$, $C_{12}$; $S_{21}$, $C_{21}$ and $S_{22}$, $C_{22}$.

Shifting of charges at the several site locations will occur when the leading edges of the pulses comprising $\phi_1$ and $\phi_2$ voltages occur as viewed in FIG. 5. Shifting of charges stop when no edges of $\phi_1$ or $\phi_2$ are present, namely at crests or troughs of the pulse trains consisting of $\phi_1$ or $\phi_2$.

It should also be noted that the term calibration as used herein means the relationship of the normalized signals obtained from the output of divider 40, such as the ratio of ($S_{11}/C_{11}$) from element 10a of matrix 10, is a function of the scene or change of scene 22s that is seen by element 10a of matrix 10 as viewed by a corresponding optical portion of the telescope that views the entire scene. Such function is the same for all elements of matrix 10. Accordingly, the relationship between the brightness of an element of matrix 10, such as 10a, will be proportional to the analogous segment of the actual scene 22s that it sees. The proportionality is the same for all elements of matrix 10.

Electrically conductive electrodes 91 are attached to the surface of layer 88, which electrodes are electrically connected to $\phi_1$ output of clock 70.

Electrically conductive electrodes 92 are attached to the surface of layer 88 and interposed between electrodes 91, which electrodes 92 are electrically connected to the $\phi_2$ output of clock 70.

Another layer of $SiO_2$, at 94 is deposited over electrodes 91 and 92.

A similar layer of $SiO_2$ is provided at 96 which interfaces at 98 with layer 94.

Electrically conductive electrodes 101 are provided within layer 96 at interface 98 and electrically connected to clock terminal $\phi_1$.

Electrically conductive electrodes 102, are interposed between electrodes 101 and are also provided within layer 96 at interface 98. Electrodes 102 are all electrically connected to clock terminal $\phi_2$.

The functions of clock 70 are shown in FIG. 5 as two series pulsed outputs versus time, as representative of outputs utilized by the circuit such as is partially shown in FIG. 4, to feed the multiplicity of detectors of matrix 10.

Figure 3:
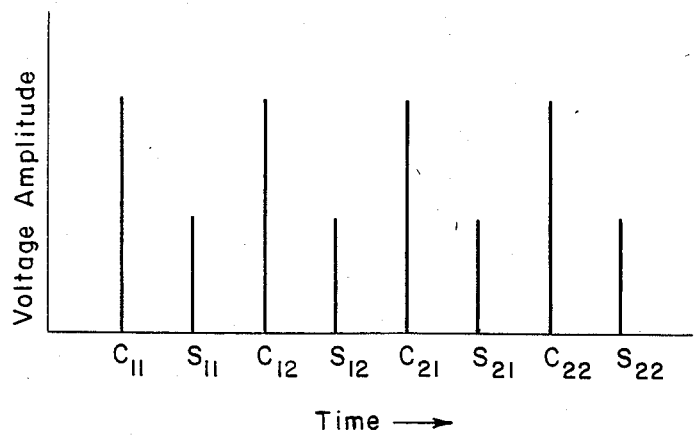
FIG. 3 is a voltage amplitude versus time chart for several exemplary elements of the matrix.

Referring again to FIGS. 1, and also FIGS. 3 and 5, analog divider 40, well known in the art, receives the S and C element outputs in their storage sequence, so that for example when $S_{11}$ is fed into divider 40 the signal level therefrom is stored in the divider so that when $C_{11}$ following $S_{11}$ is fed into the divider, the divider divides $S_{11}$ by $C_{11}$, or the inverse division thereof dependent on feed sequence may obtain, followed by division of $S_{12}$ by $C_{12}$ to obtain a ratio or signal level normalized by virtue of the division of the signal level by the calibration level in each case, to result in elimination in sensitivity non-uniformities between detector elements 10a, 10b, 10c, 10d, . . . 10n.

The output of divider 40 providing a normalized data stream of S/C ratios may be fed to an A/D converter to convert the analog data into digital format which in turn is fed to any type of digital computer such as IBM 360, for processing the data received by the system, which originates as light from a telescope (not shown). The computer is adapted for determining such information as star tracking, missile tracking, thermal imaging, and the like as fits the particular application or use of this system.

The output of clock phase $\phi_2$ is identical to the functions described in connection with clock phase $\phi_1$; except that the pulse senses are 180 degrees out of phase with respect to $\phi_1$.

The output of clock phase $\phi_1$ shows that at time period V, signal charges are stored in all A locations of the matrix. This occurs by virtue of charge being generated in body 80 resulting from illumination at 22s from a scene viewed by a telescope through which beam 22s emanates. Such generated charge is collected in layer 83 and stored under electrode element 91 at interface I between contact 84 and layer 88.

During time period V the charge resulting from a change in the scene at 22s is transferred by means of clock signals $\phi_1$ and $\phi_2$ to storage location $C_{11}$.

During time period W, DC source 16 is pulsed, as seen in FIG. 5., to turn on light calibration lamp 18, and the charge which is generated in body 80, resulting from the presence of the calibrating illuminating beam 22c, is collected by members 83 and stored under electrodes 91 at interface I at all A locations.

During time period X the charge resulting from a change in scene at 22s is transferred by means of clock signals $\phi_1$ and $\phi_2$ from $C_{11}$ storage location to $S_{11}$ storage location and the charge resulting from the calibration lamp action is transferred by means of clock signals $\phi_1$ and $\phi_2$ from A storage location to $C_{11}$ storage location.

During time period Y, all C and S locations are read out from chip 10 by shift register clocking action through an amplifier (not shown) but at end of an integral part of chip 10, the input of such amplifier being fed to analog divider 40 as hereinabove stated. During this time period sufficient clock pulses $\phi_1$ and $\phi_2$ are generated to read out the stored data from all C and S areas into analog divider 40.

It should be noted, the foregoing basically described what occurs at interface I in terms of $C_{11}$ and $S_{11}$ storage areas. However, it should be understood that the same functions are repeated with respect of the other C and S storage areas comprising the matrix of chip 10 for each element 10a, 10b, 10c, 10d . . . etc. thereof, each such element of matrix 10 creating therein a C and S storage area.

What is claimed is:

1. A self calibration imager comprising:
   a plurality of detectors during a first time period formed in a semiconductor two-dimensional matrix;
   means for applying signal illumination to said detectors;
   means for selectively providing calibration illumination to said detectors during a second time period;
   a charge coupled device (CCD) shift register formed in said semiconductor two-dimensional matrix and being operatively coupled to said detectors so as to cause charges produced by the signal illumination during a first time period to be stored at first respective stages of the shift register such that a particular stage is associated with a particular detector and so that at the end of the first time period said stored charges are transferred to a respective second stage of the shift register such that a particular second stage is associated with a particular detector, so that charges produced during said second time period are stored in said respective first stages and so that during a third time period the signals stored in said shift register are read out; and
   normalization means for normalizing each read out signal from a second stage as a function of the signal from the associated first stage.

2. The imager of claim 1 wherein said normalization means includes a divider operatively coupled to said shift register so as to divide each read out signal from a second stage by the signal from associated first stage.

3. A method of self calibration of an imager that comprises a plurality of detectors formed in a semiconductor two-dimensional matrix, a charge coupled device (CCD) shift register, formed in said semiconductor two-dimensional matrix, which has two respective stages associated with each of said detectors means for applying signal illumination to said detectors, means for selectively providing calibration illumination to said detectors and means for normalizing the signal from one stage of said shift register as a function of the signal from the other associated stage, said method comprising:
   storing charges produced by the signal illumination during a first time period at first respective stages of the CCD shift register such that a particular first stage is associated with a particular detector and at the end of the first time period, transferring said stored charges to respective second stages of the CCD shift register such that a particular second stage is associated with a particular detector and its associated first stage;
   providing calibration illumination to said detectors during a second time period and storing charges produced by said respective detectors in said first stages of the shift register asssociated with each respective detector; and
   shifting the stored signals out of said shift register during a third time period to said normalization means wherein signals produced by said signal illumination are normalized by the associated signals produced by said signal and calibration illumination.

* * * * *

UNITED STATES PATENT AND TRADEMARK OFFICE
CERTIFICATE OF CORRECTION

PATENT NO. : 4,585,934

DATED : April 29, 1986

INVENTOR(S) : Donald E. French, John A. Sekula

It is certified that error appears in the above-identified patent and that said Letters Patent is hereby corrected as shown below:

In the specification, Column 4, line 57, replace "V" with --U--.

In claim one, line 30, delete "during a first time period" and in line 34, after "tors" and before ";" (the semicolon) insert --during a first time period--.

Signed and Sealed this

Fifteenth Day of December, 1987

Attest:

DONALD J. QUIGG

*Attesting Officer*      *Commissioner of Patents and Trademarks*